(12) United States Patent
Jung et al.

(10) Patent No.: US 11,637,268 B2
(45) Date of Patent: Apr. 25, 2023

(54) DISPLAY DEVICE

(71) Applicant: SAMSUNG DISPLAY CO., LTD., Yongin-si (KR)

(72) Inventors: Woosuk Jung, Yongin-si (KR); Su Jeong Kim, Seoul (KR); Jaeheung Ha, Suwon-si (KR); Wonjong Kim, Suwon-si (KR); Yisu Kim, Seoul (KR); Changyeong Song, Suwon-si (KR); Hyein Yang, Siheung-si (KR); Yongchan Ju, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 233 days.

(21) Appl. No.: 17/021,192

(22) Filed: Sep. 15, 2020

(65) Prior Publication Data

US 2021/0217991 A1 Jul. 15, 2021

(30) Foreign Application Priority Data

Jan. 14, 2020 (KR) ........................ 10-2020-0005022

(51) Int. Cl.
 *H01L 51/52* (2006.01)
 *H01L 27/32* (2006.01)
(52) U.S. Cl.
 CPC ...... *H01L 51/5253* (2013.01); *H01L 27/3276* (2013.01); *H01L 2251/303* (2013.01)
(58) Field of Classification Search
 CPC ............. H01L 51/5253; H01L 27/3276; H01L 2251/303; H01L 27/3244; H01L 51/5256; H01L 27/3246; H01L 27/3248; H01L 27/3258; H01L 27/3262; H01L 27/3279; H01L 51/5275; H01L 2251/301; H01L 2251/558
See application file for complete search history.

(56) References Cited

U.S. PATENT DOCUMENTS

| 6,366,017 | B1 | 4/2002 | Antoniadis et al. |
| 7,875,895 | B2 | 1/2011 | Kwack et al. |
| 9,520,452 | B2 | 12/2016 | Lim et al. |
| 10,312,473 | B2 | 6/2019 | Kim et al. |
| 10,361,259 | B2 | 7/2019 | Choi et al. |
| 10,559,637 | B2 | 2/2020 | Lee et al. |
| 2011/0042702 | A1 | 2/2011 | Lim et al. |

(Continued)

FOREIGN PATENT DOCUMENTS

| KR | 10-0873082 | 12/2008 |
| KR | 10-2014-0108029 | 9/2014 |

(Continued)

*Primary Examiner* — Kyoung Lee
(74) *Attorney, Agent, or Firm* — F. Chau & Associates, LLC

(57) ABSTRACT

Provided is a display device including a base layer; a light emitting element layer disposed on the base layer; and a thin-film encapsulation layer disposed on and encapsulating the light emitting element layer, where the thin-film encapsulation layer includes an inorganic layer having at least one inorganic sub-layer pair, where the at least one inorganic sub-layer pair includes a first inorganic sub-layer having a first refractive index and a second inorganic sub-layer disposed on the first inorganic sub-layer and having a second refractive index different from the first refractive index.

19 Claims, 6 Drawing Sheets

(56) References Cited

U.S. PATENT DOCUMENTS

2018/0047800 A1* 2/2018 Choi .................. H01L 51/5253
2019/0123301 A1  4/2019 Lee et al.

FOREIGN PATENT DOCUMENTS

| KR | 10-1569406 | 11/2015 |
| KR | 10-2018-0018969 | 2/2018 |
| KR | 10-2018-0065060 | 6/2018 |
| KR | 10-1954220 | 3/2019 |
| KR | 10-2019-0045438 | 5/2019 |

* cited by examiner

DISPLAY DEVICE

CROSS-REFERENCE

This application claims priority under 35 U.S.C. § 119 to Korean Patent Application No. 10-2020-0005022, filed on Jan. 14, 2020 in the Korean Intellectual Property Office, the entire contents of which are incorporated by reference.

FIELD

The present disclosure generally relates to display devices, and more particularly relates to a display device including an organic light emitting element.

DISCUSSION OF RELATED ART

A display device may include a plurality of pixels. Each of the plurality of pixels may include an organic light emitting diode and a pixel circuit for controlling the organic light emitting diode. Each organic light emitting diode may include an anode, a cathode, and an organic light emitting layer interposed between the anode and the cathode.

When a voltage is applied to an organic light emitting diode, negative electrons may be provided to the organic light emitting layer through the cathode electrode, and positive holes may be provided to the organic light emitting layer through the anode electrode. Further, the electrons and holes provided to the organic light emitting layer may be paired as excitons, and light may be generated from the organic light emitting layer by energy released as the negative electrons and positive holes of the excitons recombine, transitioning the state of the excitons from an excited state to a ground state.

The organic light-emitting diodes may be vulnerable to deterioration from external environments including, for example, foreign substances such as moisture, oxygen, and dust, and/or ultraviolet light or the like. Technology may be desirable to protect the organic light-emitting diodes from such external environments.

SUMMARY

Exemplary embodiments of the present disclosure may provide a display device capable of suppressing deterioration of display quality from external environments.

An exemplary embodiment of the present disclosure provides a display device including a base layer; a light emitting element layer disposed on the base layer; and a thin-film encapsulation layer disposed on and encapsulating the light emitting element layer, where the thin-film encapsulation layer includes an inorganic layer having at least one inorganic sub-layer pair, where the at least one inorganic sub-layer pair includes a first inorganic sub-layer having a first refractive index and a second inorganic sub-layer disposed on the first inorganic sub-layer and having a second refractive index different from the first refractive index In an embodiment, the first inorganic sub-layer and the second inorganic sub-layer may be disposed directly on each other.

In an embodiment, the display device includes a circuit element layer disposed between the base layer and the light emitting element layer.

In an embodiment, the inorganic layer of the thin-film encapsulation layer includes at least seven inorganic sub-layer pairs.

In an embodiment, the first inorganic sub-layer may contain SiNx and the second inorganic sub-layer may contain SiON.

In an embodiment, the inorganic layer of the thin-film encapsulation layer may further include an upper inorganic sub-layer disposed on a top of the inorganic sub-layer pair.

In an embodiment, an upper inorganic sub-layer may contain the same material as the first inorganic sub-layer.

In an embodiment, the first refractive index of the first inorganic sub-layer may be greater than the second refractive index of the second inorganic sub-layer.

In an embodiment, the first refractive index of the first inorganic sub-layer may be about 1.8 to about 2.1, and the second refractive index of the second inorganic sub-layer may be about 1.5 to about 1.65.

In an embodiment, the thin-film encapsulation layer may further include a lower inorganic layer disposed between the light emitting element layer and the inorganic layer, and an organic layer disposed between the lower inorganic layer and the inorganic layer.

In an embodiment, the first inorganic sub-layer may have a first thickness and the second inorganic sub-layer may have a second thickness.

In an embodiment, a thickness of the second inorganic sub-layer may be determined on the basis of efficiency of light emitted from the light emitting element layer.

In an embodiment, the circuit element layer may include at least one transistor, and the light emitting element layer may be electrically connected to the at least one transistor.

An exemplary embodiment of the present disclosure provides a display device including a base layer, a circuit element layer disposed on the base layer, a light emitting element layer disposed on the circuit element layer and electrically connected to the circuit element layer, and a thin-film encapsulation layer disposed on the circuit element layer and the light emitting element layer to encapsulate the circuit element layer and the light emitting element layer. The thin-film encapsulation layer includes a first inorganic layer disposed on the light emitting element layer, an organic layer disposed on the first inorganic layer, and a second inorganic layer disposed on the organic layer. At least one of the first or second inorganic layers includes first inorganic sub-layers having a first refractive index and second inorganic sub-layers having a second refractive index different from the first refractive index, and the first inorganic sub-layers and the second inorganic sub-layers are alternately disposed.

In an embodiment, the first and second inorganic layers collectively include at least seven first inorganic sub-layers and at least seven second inorganic sub-layers.

In an embodiment, one of the first inorganic sub-layers of the second inorganic layer may be stacked on the light emitting element layer.

In an embodiment, one of the first inorganic sub-layers of the second inorganic layer may be disposed on an uppermost portion of the second inorganic layer.

In an embodiment, the number of the first inorganic sub-layers of the second inorganic layer may be greater than the number of the second inorganic sub-layers.

In an embodiment, the first inorganic sub-layer may contain SiNx and the second inorganic sub-layer may contain SiON.

In an embodiment, the first refractive index of the first inorganic sub-layer may be greater than the second refractive index of the second inorganic sub-layer.

In an embodiment, the first refractive index of the first inorganic sub-layer may be about 1.8 to about 2.1, and the second refractive index of the second inorganic sub-layer may be about 1.5 to about 1.65.

In an embodiment, each of the first inorganic sub-layers may have a first thickness and each of the second inorganic sub-layers may have a second thickness.

In an embodiment, a thickness of each of the second inorganic sub-layers may be determined on the basis of efficiency of light emitted from the light emitting element layer.

In an embodiment, the circuit element layer may include at least one transistor, and the light emitting element layer may be electrically connected to the at least one transistor.

BRIEF DESCRIPTION OF THE DRAWINGS

The accompanying drawings are included to provide a greater understanding of the present disclosure, and are incorporated in and constitute a part of this specification. The drawings illustrate exemplary embodiments of the present disclosure and, together with the description, serve to explain principles of the inventive concept. In the drawings.

DETAILED DESCRIPTION

Figure 1:
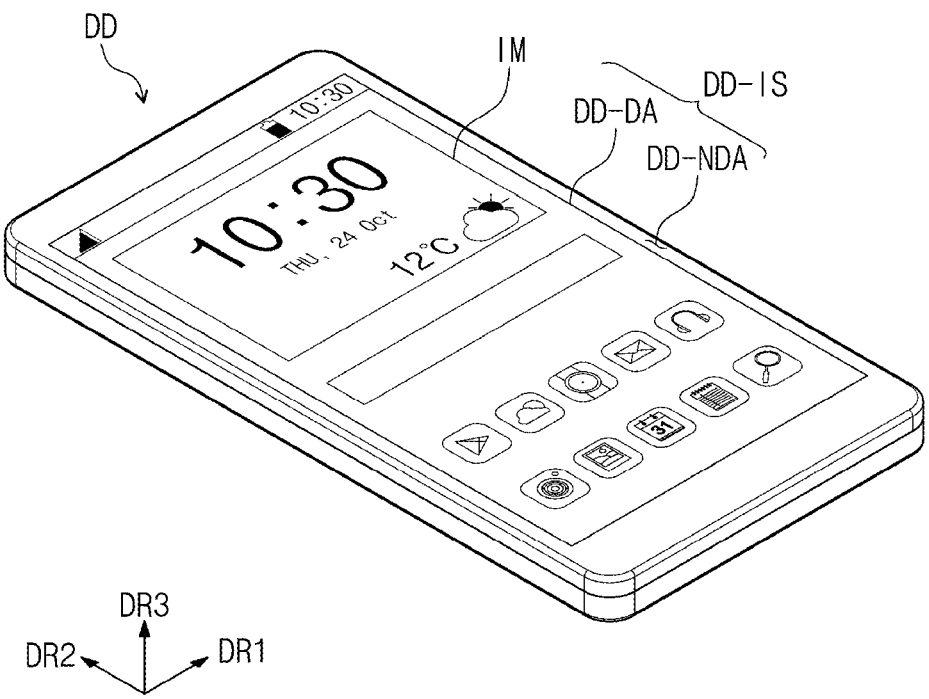
FIG. 1 is a perspective view diagram of a display device according to an embodiment of the present disclosure.

In the present specification, it will be understood that when an element (or region, layer, part, or the like) is referred to as being "on", "connected to" or "coupled to" another element, it may be directly on, connected or coupled to the other element or intervening elements may be present.

Like reference numbers may refer to like elements throughout. In the drawings, the thicknesses, ratios and dimensions of the elements may be exaggerated for effective description of the technical contents. As used herein, the term "and/or" includes any and all combinations of one or more of the associated and/or listed items.

Unless otherwise defined, all terms (including technical and scientific terms) used herein have the same meaning as commonly understood by those of ordinary skill in the art to which this present disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present disclosure will be explained in detail with reference to the accompanying drawings.

Figure 2:
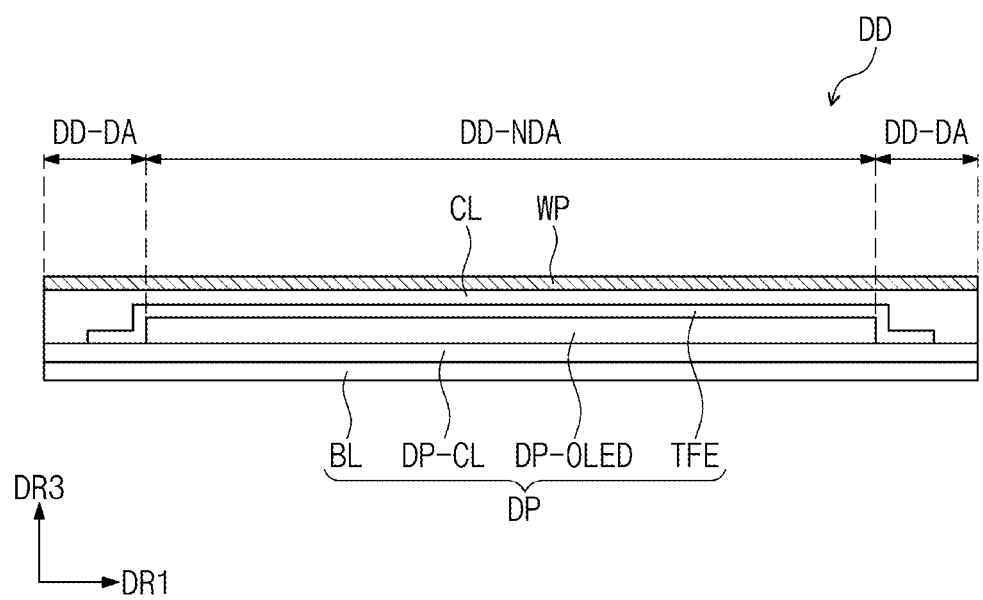
FIG. 2 is a sectional view diagram of the display device according to an embodiment of the present disclosure.

FIG. 1 illustrates a perspective view illustrating an exemplary embodiment of a display device DD according to an exemplary embodiment of the present disclosure. FIG. 2 illustrates a sectional view of the display device DD according to the present disclosure.

As illustrated in FIG. 1, the display device DD may display an image IM through a display surface DD-IS. The display surface DD-IS is parallel to the surface defined by a first direction axis DR1 and a second direction axis DR2. A third direction axis DR3 indicates the normal direction of the display surface DD-IS, that is, the thickness direction of the display device DD.

The front surface (or top surface) and the back surface (or bottom surface) of components or members, which will be described below, are distinguished from each other by the third direction axis DR3. However, the first to third direction axes DR1, DR2, and DR3 shown in the embodiment are merely examples. Hereinafter, the first to third directions are defined as directions indicated by the first to third direction axes DR1, DR2, and DR3, respectively, and refer to the same reference indicia.

In an exemplary embodiment of the present disclosure, the display device DD having the flat display surface DD-IS is illustrated, but embodiments are not limited thereto. The display device DD may further include a curved display surface. The display device DD may include a three-dimensional display surface. The three-dimensional display surface may include a plurality of display regions indicating different directions, and for example, may include a polygonal columnar display surface.

The display device DD according to the present exemplary embodiment may be a rigid display device. However, embodiments of the present disclosure are not limited thereto, and the display device DD according to an alternate embodiment of the present disclosure may be a flexible display device. The flexible display device may include a foldable display device or a bendable display device in which a partial region is bent.

In the exemplary embodiment, FIG. 1 illustrates a display device DD applicable to a mobile terminal. Electronic modules such as a camera module, a power module, and the like which need not be mounted on the main board, and the display device DD, may be disposed together in a bracket or case to constitute the mobile terminal. The display device DD according to the embodiment of the present disclosure may be applied to small and medium electronic apparatuses such as a tablet, a car navigation device, a game machine, and a smart watch, as well as large electronic apparatuses such as a television, and a monitor.

As illustrated in FIG. 1, the display surface DD-IS includes an image region DD-DA on which the image IM is displayed, and a bezel region DD-NDA which is adjacent to the image region DD-DA. The bezel region DD-NDA is a region on which the image IM is not displayed. In FIG. 1, icon graphics are illustrated in an example of the image IM.

As illustrated in FIG. 1, the image region DD-DA may be substantially rectangular. The term "substantially rectangular" includes not only a quadrangle in a mathematical sense, but also a quadrangle in which no vertex is defined in a corner region, but a boundary of a curve is defined instead.

The bezel region DD-NDA may have a shape surrounding the image region DD-DA. However, the shape of the image region DD-DA and the shape of the bezel region DD-NDA are not limited thereto, and may be designed in different shapes. The bezel region DD-NDA may be disposed only on one side of the image region DD-DA. When the display device DD is provided in an electronic apparatus, the bezel region DD-NDA need not be exposed to the outside depending on a combination type of the display device DD and other components of the electronic apparatus.

FIG. 2 illustrates a cross section of the display device DD defined by the first direction axis DR1 and the second direction axis DR2. In FIG. 2, the components of the display device DD are simplified to describe the stacking relationships therebetween.

The display device DD according to an embodiment of the present disclosure may include a display panel DP, a cover layer CL, and a window WP. At least some components of the display panel DP, the cover layer CL, or the window WP may be formed by a continuous process, or at least some of the components may adhere to each other through an adhesive member. In an embodiment of the present disclosure, the cover layer CL and the window WP may be replaced by other components or omitted.

The display panel DP according to an embodiment of the present disclosure may be a light emitting display panel, and is not particularly limited. For example, the display panel DP may be an organic display panel or a quantum dot display panel. Such panels are distinguished according to the material of the light emitting device. The light emitting layer of the organic display panel may include an organic light emitting material. The light emitting layer of the quantum dot display panel may include a quantum dot and/or a quantum rod. Hereinafter, the display panel DP is described as an organic display panel, but is not limited thereto.

The display panel DP includes a base layer BL, a circuit element layer DP-CL, a light emitting element layer DP-OLED, and a thin-film encapsulation layer TFE, which are disposed on the base layer BL.

The base layer BL may include at least one synthetic resin film. The base layer BL may include a glass substrate, a metal substrate, an organic and/or inorganic composite substrate, or the like.

The circuit element layer DP-CL is disposed on the base layer BL. The circuit element layer DP-CL may include at least one intermediate insulating layer and circuit elements. The intermediate insulating layer includes at least one inorganic layer and at least one organic layer. The circuit elements may include signal lines, a driving circuit of pixels, and the like.

The light emitting element layer DP-OLED is disposed on the circuit element layer DP-CL. The light emitting element layer DP-OLED may include organic light emitting diodes as light emitting devices. The light emitting element layer DP-OLED may further include an organic layer such as a pixel defining layer.

The thin-film encapsulation layer TFE may be disposed on the light emitting element layer DP-OLED to encapsulate the light emitting element layer DP-OLED. The thin-film encapsulation layer TFE may cover the image region DD-AA as a whole. The thin-film encapsulation layer TFE may cover a portion of the bezel region DD-NAA.

The thin-film encapsulation layer TFE includes a plurality of thin films. Some thin films are disposed to improve optical efficiency, and some thin films are disposed to protect the organic light emitting diodes. The thin-film encapsulation layer TFE will be described in detail later.

The cover layer CL is disposed on the thin-film encapsulation layer TFE of the display panel DP to cover the thin-film encapsulation layer TFE. In an embodiment, the cover layer CL may contain a polymeric material. The cover layer CL has a light transmitting property and is arranged to protect the thin-film encapsulation layer TFE. The cover layer CL provides a flat surface on the upper side. Accordingly, a constituent element disposed on the thin-film encapsulation layer TFE may be stably disposed on the flat surface provided by the cover layer CL.

The window WP is disposed on the cover layer CL. The window WP according to an embodiment of the present disclosure may include a glass substrate and/or a synthetic resin film. In an embodiment, an adhesive layer may be further disposed on the cover layer CL, and the window WP may be attached to the cover layer CL by the adhesive layer.

The window (WP) is not limited to a single layer. The window WP may include two or more films attached to each other by an adhesive member. Although not separately illustrated, the window WP may further include a functional coating layer. The functional coating layer may include an anti-fingerprint layer, an anti-reflection layer, a hard coating layer, and the like.

Figure 3:
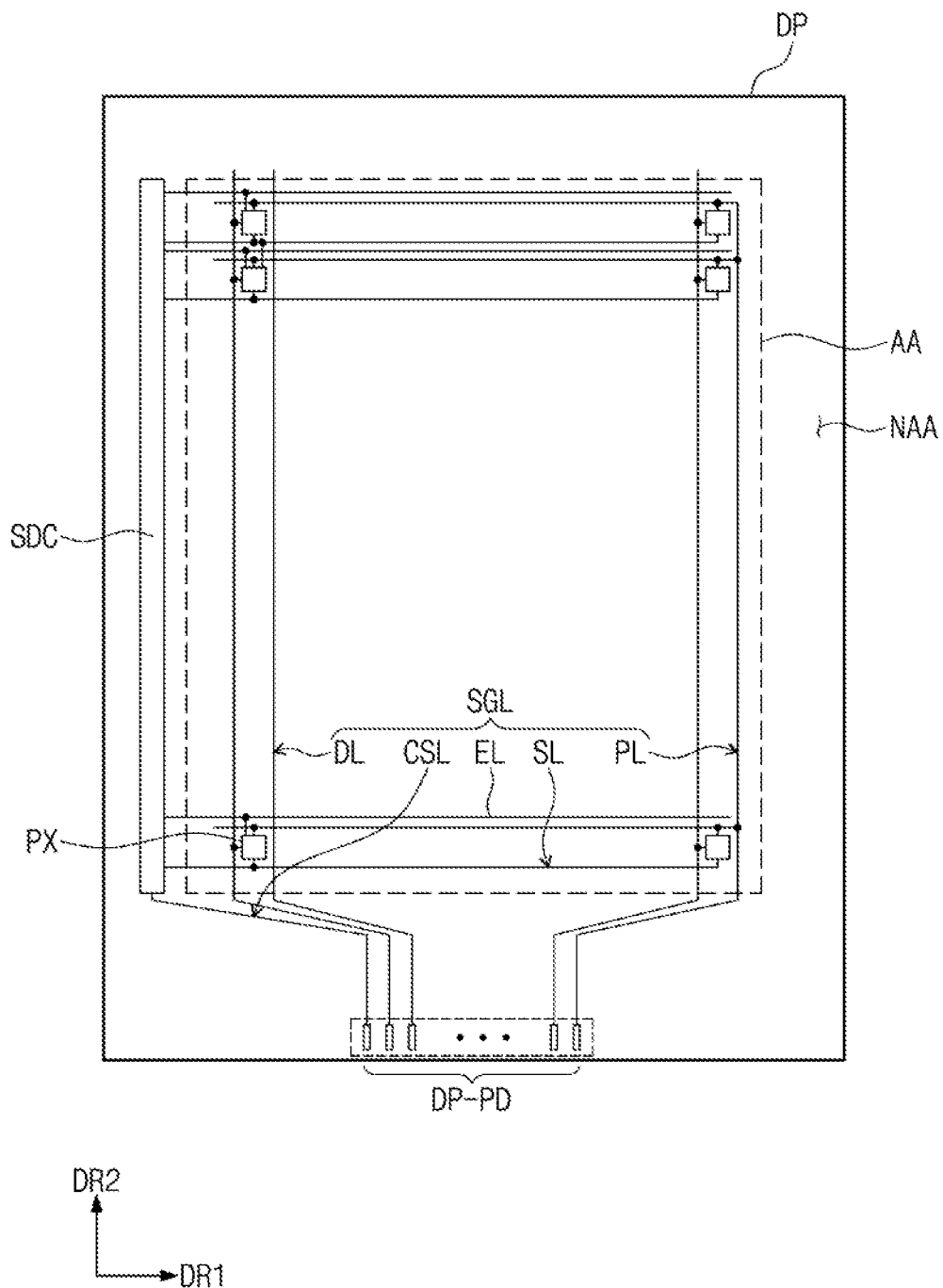
FIG. 3 is a plan view diagram of a display panel according to an embodiment of the present disclosure.

FIG. 3 illustrates a plan view of the display panel DP according to an embodiment of the present disclosure.

As illustrated in FIG. 3, the display panel DP includes a scan driving circuit SDC, a plurality of signal lines SGL (hereinafter, referred to as signal lines), and a plurality of signal pads DP-PD (hereinafter, referred to as signal pads), and a plurality of pixels PX (hereinafter, referred to as pixels).

An active region AA and a peripheral region NAA corresponding to the image region DD-DA and the bezel region DD-NDA illustrated in FIG. 1 may be defined in the display panel DP. In the present specification, "a region/part corresponds to another region/part" means "being overlapped with each other", but is not limited to the meaning that they have the same area and/or the same shape. The pixels PX may be disposed in the active region AA, and the scan driving circuit SDC and the signal pads DP-PD may be disposed in the peripheral region NAA. In addition, a plurality of signal lines SGL may be disposed in the active region AA and the peripheral region NAA.

The scan driving circuit SDC generates a plurality of scan signals (hereinafter, referred to as scan signals), and sequentially outputs the scan signals to a plurality of scan lines SL (hereinafter, referred to as scan lines). The scan driving circuit may further output another control signal to the driving circuit of the pixels PX. In an embodiment, the scan driving circuit SDC may further output a plurality of light emitting control signals (hereinafter, referred to as light emitting control signals).

The scan driving circuit SDC may include a plurality of transistors formed through the same process as the driving circuit of the pixels PX, such as, for example, a low temperature polycrystalline silicon (LTPS) process or a low temperature polycrystalline oxide (LTPO) process.

The signal lines SGL include scan lines SL, data lines DL, light emitting control lines EL, a power line PL, and a control signal line CSL. Each of the scan lines SL, the data lines DL, and the light emitting control lines EL is connected to a corresponding pixel PX of the pixels PX. The power line PL is connected to the pixels PX. The control signal line CSL may provide control signals to the scan driving circuit SDC. The power line PL may transfer at least one of a first driving voltage ELVDD and a second driving voltage ELVSS to be provided to the pixel PX.

The active region AA may be defined as a region in which the pixels PX are disposed. A plurality of electronic elements is disposed in the active region AA. The electronic elements include an organic light emitting diode provided in each of the pixels PX and a pixel driving circuit connected thereto. The scan driving circuit SDC, the signal lines SGL, the signal pads DP-PD, and the pixel driving circuit may be included in the circuit element layer DP-CL as illustrated in FIG. 2.

The plurality of pixels PX may include a plurality of groups that generate different colors of light. For example, the pixels PX may include red pixels that generate red color light, green pixels that generate green color light, and blue pixels that generate blue color light. The light emitting diode of the red pixel, the light emitting diode of the green pixel, and the light emitting diode of the blue pixel may include light emitting layers of different materials.

Figure 4:
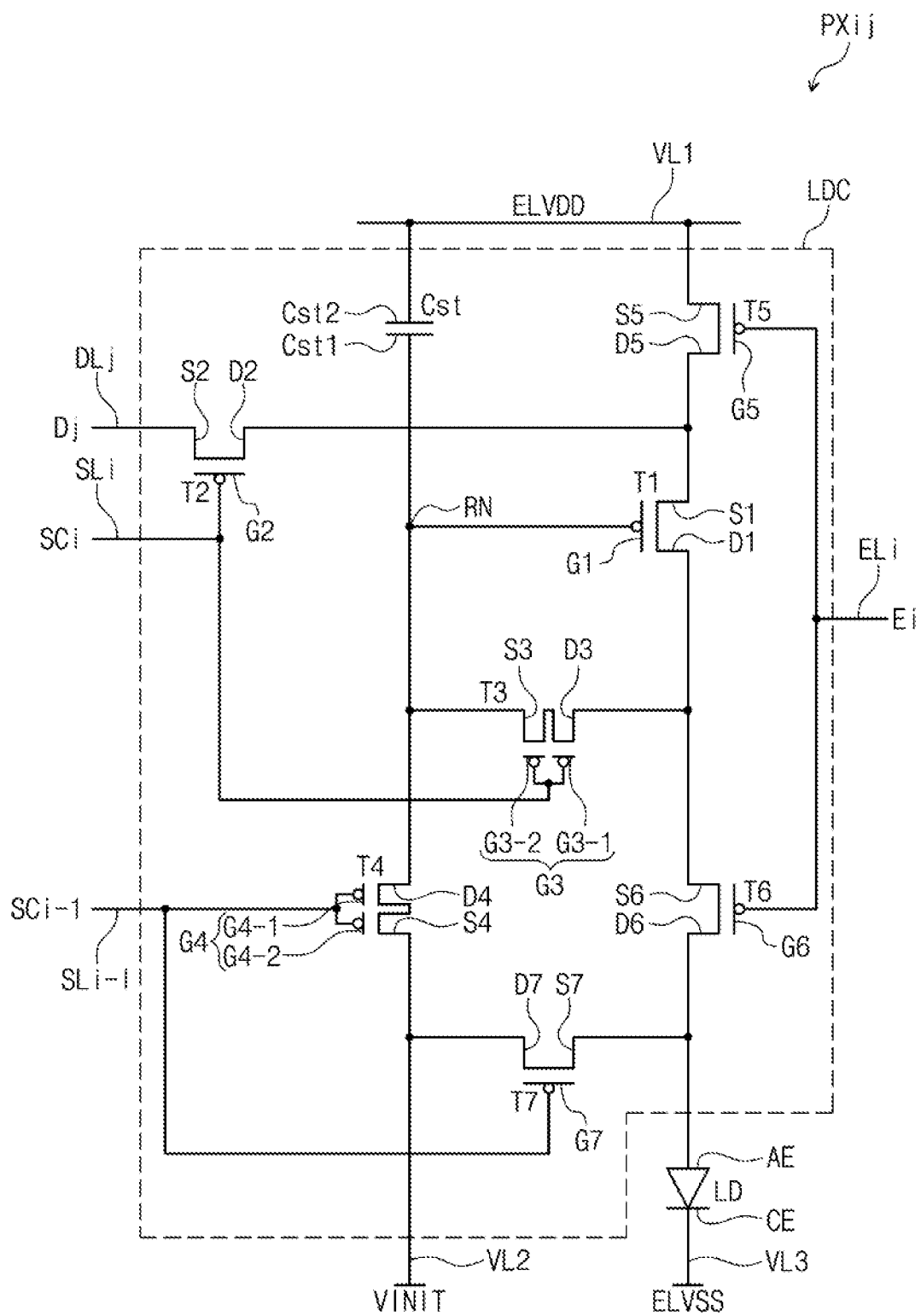
FIG. 4 is an equivalent circuit diagram of a pixel according to an embodiment of the present disclosure.

FIG. 4 illustrates an equivalent circuit for a pixel PXij according to the present disclosure.

The display panel DP illustrated in FIG. 3 may include n scan lines SL1 to SLn, n light emitting control lines EL1 to ELn, and m data lines DL1 to DLm. In FIG. 4, the pixel PXij as exemplified is connected to an i-th scan line SLi and an (i−1)-th scan line SL(i−1) of the n scan lines SL1 to SLn, and is connected to an i-th light emitting control line ELi of the n light emitting control lines EL1 to ELn, and is connected to a j-th data line DLj of the m data lines DL1 to DLm.

The pixel PXij includes a pixel driving circuit LDC and a light emitting diode LD. In the embodiment, the pixel driving circuit LDC may include first to seventh transistors T1 to T7 and a capacitor Cst. In the embodiment, the first to seventh transistors T1 to T7 are described as being P-type transistors. However, the embodiment of the present disclosure is not limited thereto, and the first to seventh transistors T1 to T7 may be implemented as any one of a P-type transistor and an N-type transistor. In addition, at least one of the first to seventh transistors T1 to T7 may be omitted in an embodiment of the inventive concept.

In the embodiment, the first transistor T1 may be a driving transistor, and the second to seventh transistors T2 to T7 may be switching transistors. The capacitor Cst is connected between the first voltage line VL1 receiving the first power voltage ELVDD and a reference node RN. The capacitor Cst includes a first electrode Cst1 connected to the reference node RN and a second electrode Cst2 connected to the first voltage line VL1.

The first transistor T1 is connected between the first voltage line VL1 and the anode AE of the light emitting diode LD. A source S1 of the first transistor T1 is electrically connected to the first voltage line VL1. In the present specification, "electrically connected between a transistor and a signal line or between a transistor and a transistor" means that the source, drain, or gate of the transistor have an integral shape with the signal line or are connected through a connection electrode. Another transistor such as but not limited to T5 may be disposed or omitted between the source S1 of the first transistor T1 and the first voltage line VL1.

A drain D1 of the first transistor T1 is electrically connected to the anode AE of the light emitting diode LD. Another transistor such as but not limited to T6 may be disposed or omitted between the drain D1 of the first transistor T1 and the anode AE of the light emitting diode LD. A gate G1 of the first transistor T1 is electrically connected to the reference node RN.

The second transistor T2 is connected between the j-th data line DLj and the source S1 of the first transistor T1. A source S2 of the second transistor T2 is electrically connected to the j-th data line DLj, and a drain D2 of the second transistor T2 is electrically connected to the source S1 of the first transistor T1. In the embodiment, a gate G2 of the second transistor T2 may be electrically connected to the i-th scan line SLi.

The third transistor T3 is connected between the reference node RN and the drain D1 of the first transistor T1. A drain D3 of the third transistor T3 is electrically connected to the drain D1 of the first transistor T1, and a source S3 of the third transistor T3 is electrically connected to the reference node RN. The third transistor T3 may include a plurality of gates. In the embodiment, the third transistor T3 may include two gates G3-1 and G3-2, and the gates G3-1 and G3-2 may be electrically connected to the i-th scan line GLi. The two gates G3-1 and G3-2 of the third transistor T3 may be referred to as one gate G3. In another embodiment of the present disclosure, the third transistor T3 may include a single gate.

The fourth transistor T4 is connected between the reference node RN and a second voltage line VL2. A drain D4 of the fourth transistor T4 is electrically connected to the reference node RN, and a source S4 of the fourth transistor T4 is electrically connected to the second voltage line VL2. The fourth transistor T4 may include a plurality of gates. In another embodiment of the present disclosure, the fourth transistor T4 may include a single gate.

In the exemplary embodiment, two gates G4-1 and G4-2 of the fourth transistor T4 may be electrically connected to the i−1-th scan line SLi−1. The two gates G4-1 and G4-2 of the fourth transistor T4 may be referred to as one gate G4. Since each of the third transistor T3 and the fourth transistor T4 has a plurality of gates, the leakage current of the pixel PXij may be reduced.

The fifth transistor T5 is connected between the first voltage line VL1 and the source S1 of the first transistor T1. A source S5 of the fifth transistor T5 is electrically connected to the first voltage line VL1, and a drain D5 of the fifth transistor T5 is electrically connected to the source S1 of the first transistor T1. The gate G5 of the fifth transistor T5 may be electrically connected to the i-th light emitting control line ELi.

The sixth transistor T6 is connected between the drain D1 of the first transistor T1 and the light emitting diode LD. A source S6 of the sixth transistor T6 is electrically connected to the drain D1 of the first transistor T1, and a drain D6 of the sixth transistor T6 is electrically connected to the anode AE of the light emitting diode LD. A gate G6 of the sixth transistor T6 may be electrically connected to the i-th light emitting control line ELi. In another embodiment of the present disclosure, the gate G6 of the sixth transistor T6 may be connected to a different signal line from that of the gate G5 of the fifth transistor T5.

The seventh transistor T7 is connected between the drain D6 of the sixth transistor T6 and the second voltage line VL2. A source S7 of the seventh transistor T7 is electrically connected to the drain D6 of the sixth transistor T6, and a drain D7 of the seventh transistor T7 is electrically connected to the second voltage line VL2. A gate G7 of the second transistor T2 may be electrically connected to the (i−1)-th scan line SL(i−1) of a first group of the plurality of groups that generate different colors of light.

The cathode CE of the light emitting diode LD may be connected to the third voltage line VL3 that transfers the second driving voltage ELVSS. The structure of the pixel PXij according to an embodiment is not limited to the structure illustrated in FIG. 4, and the number of transistors and the number of capacitors included in one pixel PX and the connection relationship thereof may be variously modified.

Figure 5:
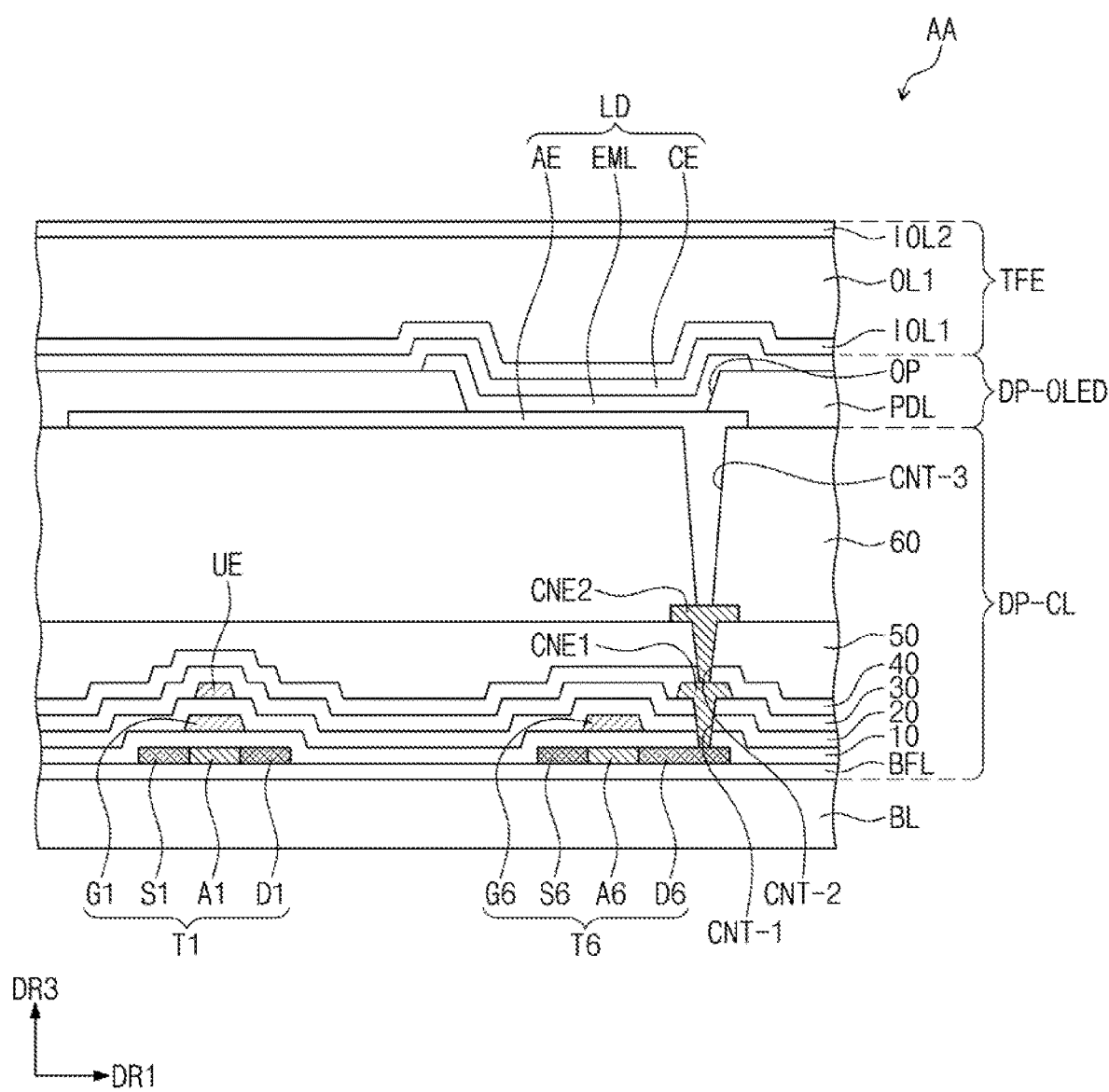
FIG. 5 is a sectional view diagram of an active region of the display panel according to an embodiment of the present disclosure.

FIG. 5 illustrates a sectional view of the active region AA of the display panel DP according to an embodiment of the present disclosure. FIG. 5 depicts a cross-section of portions corresponding to the first transistor T1 and the sixth transistor T6 illustrated in FIG. 4.

Referring to FIG. 5, the active region AA of the display panel DP includes a base layer BL, a circuit element layer DP-CL disposed on the base layer, a display element layer DP-OLED, and a thin-film encapsulation layer TFE. The display panel DP may further include functional layers such as a refractive index control layer. The circuit element layer DP-CL includes at least a plurality of insulating layers and a circuit element. Hereinafter, the insulating layers may include an organic layer and/or an inorganic layer.

The insulating layers, the semiconductor layer, and the conductive layer are provided by coating, vapor deposition, or the like. Then, the insulating layers, the semiconductor layer, and the conductive layer may be selectively patterned by photolithography. In this manner, a semiconductor pattern, a conductive pattern, signal lines, and the like are formed.

The base layer BL may include a synthetic resin film. The synthetic resin film may include a thermosetting resin. Particularly, the synthetic resin film may be a polyimide resin film, and the material thereof is not particularly limited. The synthetic resin film may include at least one of an acrylic resin, a methacrylic resin, polyisoprene, a vinyl resin, an epoxy resin, a urethane resin, a cellulose resin, a siloxane resin, a polyamide resin, or a perylene resin. In addition, the base layer may include a glass substrate, a metal substrate, an organic/inorganic composite substrate, or the like.

At least one inorganic layer is formed on the top surface of the base layer BL. The inorganic layer may include at least one of aluminum oxide, titanium oxide, silicon oxide, silicon oxynitride, zirconium oxide, or hafnium oxide. The inorganic layer may be formed in multiple layers. At least one of the multilayer inorganic layers may be a buffer layer BFL.

The buffer layer BFL improves the bonding force between the base layer BL and the semiconductor pattern and/or the conductive pattern. The buffer layer BFL may include a silicon oxide layer and a silicon nitride layer. The silicon oxide layer and the silicon nitride layer may be alternately stacked.

The semiconductor pattern is disposed on the buffer layer BFL. The semiconductor pattern may be directly disposed on the buffer layer BFL. The semiconductor pattern may include a silicon semiconductor. The semiconductor pattern may include polysilicon. However, the embodiment of the present disclosure is not limited thereto, and the semiconductor pattern may include amorphous silicon.

FIG. 5 illustrates only a part of the semiconductor pattern, and the semiconductor pattern may be further disposed in another region of the pixel PXij (refer to FIG. 4). The semiconductor pattern has different electrical properties depending on whether it is doped. The semiconductor pattern may include a doped region and a non-doped region. The doped region may be doped with an N-type dopant or a P-type dopant. The P-type transistor includes a doped region doped with a P-type dopant.

The doped region is more conductive than the non-doped region and substantially functions as an electrode or signal line. The non-doped region substantially corresponds to the active channel of the transistor. In other words, a portion of the semiconductor pattern may be an active channel of the transistor, another portion may be a source or drain of the transistor, and yet another portion may be a connection electrode or a connection signal line.

As illustrated in FIG. 5, the source S1, an active channel A1, and the drain D1 of the first transistor T1 are formed from the semiconductor pattern. The source S1 and the drain D1 of the first transistor T1 extend from the active channel A1 in directions opposite to each other. In addition, the source S6, the active channel A6, and the drain D6 of the sixth transistor T6 are formed from the semiconductor pattern. The source S6 and the drain D6 of the sixth transistor T6 extend from the active channel A6 in directions opposite to each other. Although not separately illustrated in this figure, the source D6 of the sixth transistor T6 may be connected to the drain D1 of the first transistor T1. Moreover, the source D6 of the sixth transistor T6 may be integrally formed with the drain D1 of the first transistor T1

The first insulating layer 10 is disposed on the buffer layer BFL. The first insulating layer 10 is commonly overlapped with the plurality of pixels PX (refer to FIG. 4) and covers the semiconductor pattern. The first insulating layer 10 may be an inorganic layer and/or an organic layer, and may have a single-layer structure or a multilayer structure. The first insulating layer 10 may include at least one of aluminum oxide, titanium oxide, silicon oxide, silicon oxynitride, zirconium oxide, or hafnium oxide. In the embodiment, the first insulating layer 10 may be a single layer of silicon oxide. In addition to the first insulating layer 10, the insulating layer of the circuit element layer DP-CL to be described may be an inorganic layer and/or an organic layer, and may have a single layer or a multilayer structure. The inorganic layer may include at least one of the above materials.

The gate G1 of the first transistor T1 is disposed on the first insulating layer 10. The gate G1 may be a part of the metal pattern. The gate G1 of the first transistor T1 is overlapped on the active channel A1 of the first transistor T1. In the process of doping the semiconductor pattern, the gate G1 of the first transistor T1 may be used as a mask.

A second insulating layer 20 covering the gate G1 is disposed on the first insulating layer 10. The second insulating layer 20 is commonly overlapped on the plurality of pixels PX (refer to FIG. 1). The second insulating layer 20 may be an inorganic layer and/or an organic layer, and may have a single-layer structure or a multilayer structure. In the embodiment, the second insulating layer 20 may be a single layer of silicon oxide.

The upper electrode UE may be disposed on the second insulating layer 20. The upper electrode UE may be overlapped on the gate G1. The upper electrode UE may be a part of the metal pattern or a part of the doped semiconductor pattern. A portion of the gate G1 and the upper electrode UE overlapped on the gate G1 may define the capacitor Cst (refer to FIG. 4). In an embodiment of the present disclosure, the upper electrode UE may be omitted. In an embodiment of the present disclosure, the second insulating layer 20 may be replaced with an insulating pattern.

Although not separately illustrated, the first electrode Cst1 and the second electrode Cst2 of the capacitor Cst (refer to FIG. 4) may be formed through the same process as that of the gate G1 and the upper electrode UE. The first electrode Cst1 may be disposed on the first insulating layer 10. The first electrode Cst1 may be electrically connected to the gate G1. The first electrode Cst1 may be integrally formed with the gate G1.

The second electrode Cst2 may be disposed on the second insulating layer 20. The second electrode Cst2 may be electrically connected to the upper electrode UE. The second electrode Cst2 may be integrally formed with the upper electrode UE.

A third insulating layer 30 covering the upper electrode UE is disposed on the second insulating layer 20. In the embodiment, the third insulating layer 30 may be a single layer of silicon oxide. Although not separately illustrated and described, the sources S2 to S7 (refer to FIG. 4), the drains D2 to D7 (refer to FIG. 4), and the gates G2 to G7 (refer to FIG. 4) of the second to seventh transistors T2 to T7 (refer to FIG. 4) may be formed through the same process as that of the source S1, the drain D1, and the gate G1 of the first transistor T1.

The first connection electrode CNE1 may be disposed on the third insulating layer 30. The first connection electrode CNE1 may be connected to the drain D6 of the sixth transistor T6 through a contact hole CNT-1 penetrating through the first to third insulating layers 10 to 30.

A fourth insulating layer 40 covering the first connection electrode CNE1 may be disposed on the third insulating layer 30. The fourth insulating layer 40 may be a single layer of silicon oxide. A fifth insulating layer 50 is disposed on the fourth insulating layer 40. The fifth insulating layer 50 may be an organic layer. The second connection electrode CNE2 may be disposed on the fifth insulating layer 30. The second connection electrode CNE2 may be connected to the first connection electrode CNE1 through a contact hole CNT-2 penetrating through the fourth insulating layer 40 and the fifth insulating layer 50.

A sixth insulating layer 60 covering the second connection electrode CNE2 is disposed on the fifth insulating layer 50. The sixth insulating layer 60 may be an organic layer. The anode AE is disposed on the sixth insulating layer 60. The anode AE is connected to the second connection electrode CNE2 through a contact hole CNT-3 penetrating the sixth insulating layer 60. An opening OP is defined in the pixel defining layer PDL. The opening OP of the pixel defining layer PDL exposes at least a portion of the anode AE.

A light emitting layer EML is disposed on the anode AE. The light emitting layer EML may be disposed in a region corresponding to the opening OP. The light emitting layer EML may be formed separately from each of the plurality of pixels PX (refer to FIG. 3).

Although the patterned light emitting layer EML is illustrated in the embodiment, the light emitting layer EML may be commonly disposed in the plurality of pixels PX. In this case, the light emitting layer EML may generate white light or blue light. In addition, the light emitting layer EML may have a multilayer structure. The cathode CE is disposed on the light emitting layer EML. The cathode CE is commonly disposed in the plurality of pixels PX.

A hole control layer may be disposed between the anode AE and the light emitting layer EML. In addition, an electronic control layer may be disposed between the light emitting layer EML and the cathode CE.

The thin-film encapsulation layer TFE is disposed on the cathode CE. The thin-film encapsulation layer TFE is commonly disposed in the plurality of pixels PX. In the embodiment, the thin-film encapsulation layer TFE directly covers the cathode CE. In an embodiment of the present disclosure, a capping layer directly covering the cathode CE may be further disposed under the TFE. In an embodiment of the present disclosure, the stacked structure of the light emitting diode LD may have an inverted structure relative to the exemplary structure illustrated in FIG. 5.

The thin-film encapsulation layer TFE includes at least an inorganic layer or an organic layer. In an embodiment of the present disclosure, the thin-film encapsulation layer TFE includes a first inorganic layer IOL1 (or lower inorganic layer), a second inorganic layer IOL2, and an organic layer OL1. The first inorganic layer IOL1 is disposed on the cathode CE and contacts the cathode CE. In another embodiment, a capping layer containing an organic material may be further disposed between the cathode CE and the first inorganic layer TOLL The capping layer protects the cathode CE from subsequent processes such as sputtering and improves the light emission efficiency of the light emitting diode LD. The capping layer may have a refractive index larger than that of the first inorganic layer TOLL In addition, an inorganic layer, such as a LiF layer, may be further disposed between the capping layer and the first inorganic layer IOU. The LiF layer may improve the light emission efficiency of the light emitting diode LD.

The first inorganic layer IOL1 and the second inorganic layer IOL2 protect the display element layer DP-OLED from moisture and oxygen, and the organic layer OL1 protects the display element layer DP-OLED from foreign substances such as dust particles. The first inorganic layer IOL1 may be any one of a silicon nitride layer, a silicon oxynitride layer, a silicon oxide layer, or the like. In one embodiment of the present disclosure, the first inorganic layer IOL1 may include a titanium oxide layer, an aluminum oxide layer, and the like. The organic layer OL1 may include an acryl-based organic layer, but is not limited thereto. In an embodiment, the second inorganic layer IOL2 may block or reflect ultraviolet rays, and the organic layer OL1 may include a material capable of absorbing ultraviolet rays. Therefore, it is possible for the thin-film encapsulation layer TFE to prevent the ultraviolet rays from being transferred to the circuit element layer DP-CL and/or the light emitting element layer DP-OLED.

Figure 6:
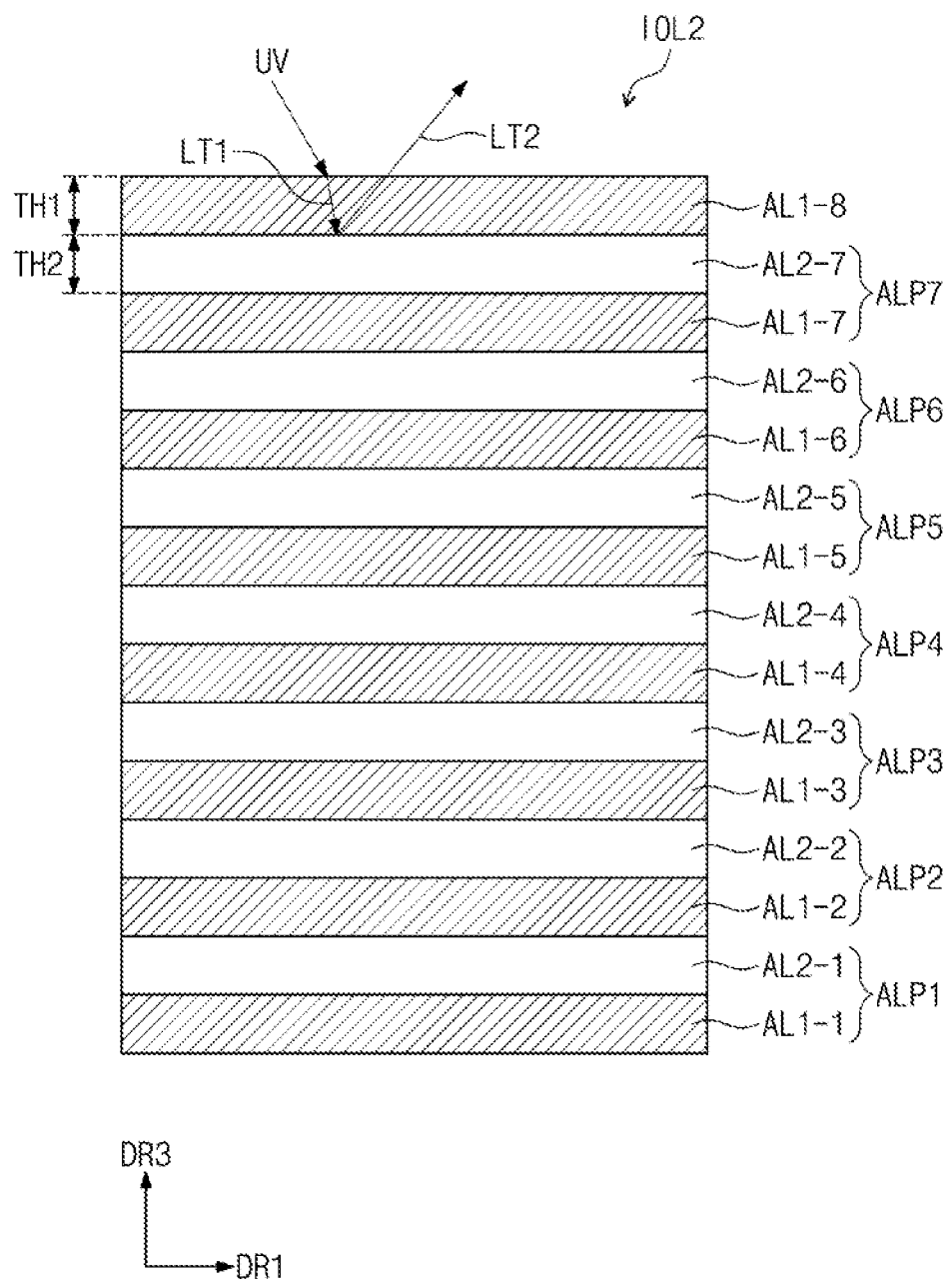
FIG. 6 is an enlarged sectional view diagram of a second inorganic layer illustrated in FIG. 5.

FIG. 6 illustrates an enlarged sectional view of an exemplary second inorganic layer IOL2 of FIG. 5.

Referring to FIGS. 5 and 6, the second inorganic layer IOL2 may include first inorganic sub-layers AL1-1 to AL1-8 and second inorganic sub-layers AL2-1 to AL2-7, which are alternately stacked in the thickness direction of the base layer BL, that is, in the third direction DR3. Among the first inorganic sub-layers AL1-1 to AL1-8 and the second inorganic sub-layers AL2-1 to AL2-7, the first inorganic sub-layer and the second inorganic sub-layer that are adjacent to each other may form an inorganic sub-layer pair. For example, the first inorganic sub-layer AL1-1 and the second inorganic sub-layer AL2-1 form a first inorganic sub-layer pair ALP1, the first inorganic sub-layer AL1-2 and the second inorganic sub-layer AL2-2 form a second inorganic sub-layer pair ALP2, the first inorganic sub-layer AL1-3 and the second inorganic sub-layer AL2-3 form a third inorganic sub-layer pair ALP3, the first inorganic sub-layer AL1-4 and the second inorganic sub-layer AL2-4 form a fourth inorganic sub-layer pair ALP4, the first inorganic sub-layer AL1-5 and the second inorganic sub-layer AL2-5 form a fifth inorganic sub-layer pair ALP5, the first inorganic sub-layer AL1-6 and the second inorganic sub-layer AL2-6 form a sixth inorganic sub-layer pair ALP6, and the first inorganic sub-layer AL1-7 and the second inorganic sub-layer AL2-7 form a seventh inorganic sub-layer pair ALP7.

In an embodiment, the second inorganic layer IOL2 may include seven inorganic sub-layer pairs, such as first to seventh inorganic sub-layer pairs ALP1 to ALP7 and another inorganic sub-layer AL1-8, but the number of inorganic sub-layer pairs and/or layers of the present disclosure is not limited thereto. The inorganic sub-layer AL1-8 may be disposed at the top of the second inorganic layer IOL2 and thus may be referred to as an upper inorganic sub-layer. In addition, the first inorganic sub-layers AL1-1 and AL1-8 are disposed at the lowermost end of the second inorganic layer IOL2, that is, the portion contacting the organic layer OL1, and at the uppermost end of the second inorganic layer IOL2, respectively.

In an embodiment, when each of the first inorganic sub-layers AL1-1 to AL1-8 has a first refractive index, and each of the second inorganic sub-layers AL2-1 to AL2-7 has a second refractive index, the first refractive index is greater than the second refractive index.

For example, each of the first inorganic sub-layers AL1-1 to AL1-8 may include SiNx having a first refractive index of about 1.8 to about 2.1, and each of the second inorganic sub-layers AL2-1 to AL2-7 may include SiON having a second refractive index of about 1.5 to about 1.65.

However, the materials of the first inorganic sub-layers AL1-1 to AL1-8 and the second inorganic sub-layers AL2-1 to AL2-7 are not limited thereto, and the first inorganic sub-layers AL1-1 to AL1-8 and the second inorganic sub-layers AL2-1 to AL2-7 may be formed of materials having different refractive indices. In addition, considering the fact that the refractive index of SiON increases as the proportional content of nitrogen to oxygen in SiON increases and the refractive index of SiON decreases as the proportional content of oxygen to nitrogen in SiON increases, the refractive index of SiON, or the like, may be adjusted.

Moreover, the first inorganic sub-layers AL1-1 to AL1-8 may include materials such as topological insulators, with relatively high refractive indices approaching 6.0 in the infrared frequency range, which may also be visibly transparent at relevant nanoscale thicknesses. Similarly, the second inorganic sub-layers AL2-1 to AL2-7 may include materials such as aerogels, with relatively low refractive indices approaching 1.0.

In a case where the second inorganic layer IOL2 has the above-mentioned structure, when the angle of incidence for environmental light is greater than the critical angle at the interface between adjacent inorganic sub-layers having different refractive indices in the first inorganic sub-layers AL1-1 to AL1-8 and the second inorganic sub-layers AL2-1 to AL2-7, environmental light, such as ultraviolet light UV, does not penetrate the interface, which may reflect substantially all of it for substantially total reflection.

Therefore, ultraviolet light UV incident from the outside of the IOL2 may not penetrate through the second inorganic layer IOL2 and may be reflected by the interfaces between the first inorganic sub-layers AL1-1 to AL1-8 having the first refractive index and the second inorganic sub-layers AL2-1 to AL2-7 having the second refractive index. For example, the ultraviolet light UV incident from the outside may be converted into a first light LT1 penetrating through the first inorganic sub-layer AL1-8. The first light LT1 may be reflected at a boundary between the first inorganic sub-layer AL1-8 and the second inorganic sub-layer AL2-7 and may be output to the outside as a second light LT2. As described above, as the ultraviolet light UV incident from the outside does not penetrate through the second inorganic layer IOL2 and is reflected, the light emitting diode LD may be protected against deterioration from the ultraviolet light UV.

Figure 7:
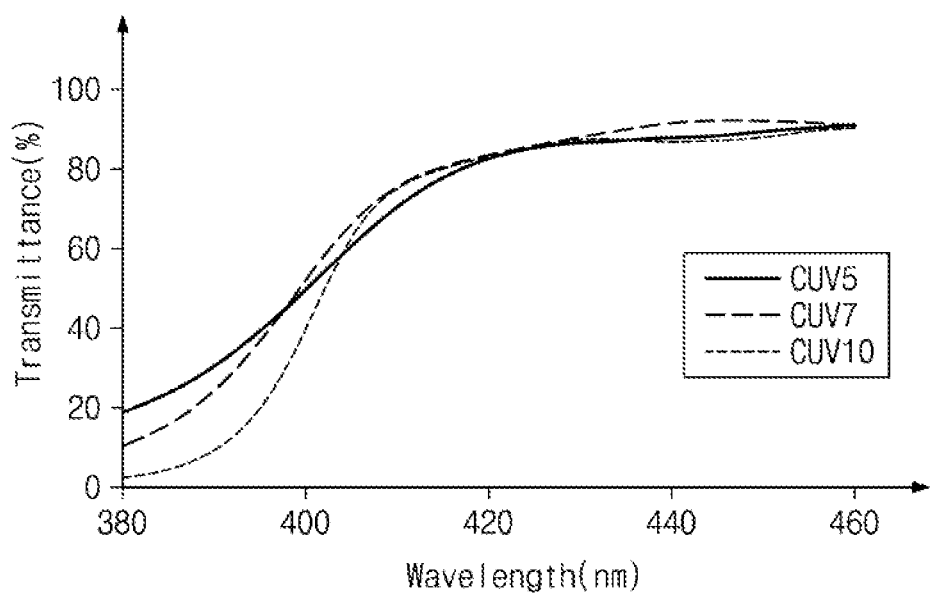
FIG. 7 is a graphical diagram illustrating light transmittance according to the number of inorganic sub-layer pairs included in the second inorganic layer.

FIG. 7 illustrates light transmittance according to the number of inorganic sub-layer pairs included in the second inorganic layer IOL2.

Referring to FIGS. 6 and 7, a first curve CUV5 shows the light transmittance as an example when the second inorganic layer IOL2 includes only the first to fifth inorganic sub-layer pairs ALP1 to ALP5 and the top inorganic sub-layer AL1-8. A second curve CUV7 shows the light transmittance as an example when the second inorganic layer IOL2 includes the first to seventh inorganic sub-layer pairs ALP1 to ALP7 and the top inorganic sub-layer AL1-8. A third curve CUV10 shows the light transmittance as an example when the second inorganic layer IOL2 further includes three inorganic sub-layer pairs not illustrated in FIG. 6, in addition to the first to seventh inorganic sub-layer pairs ALP1 to ALP7 and the top inorganic sub-layer ALP1-8.

As the second inorganic layer IOL2 includes a smaller number of inorganic sub-layer pairs, the transmittance of ultraviolet rays (for example, a wavelength of about 400 nm or less) is increased, and as the second inorganic layer IOL2 includes a larger number of inorganic sub-layer pairs, the transmittance of ultraviolet rays is decreased. That is, the transmittance of ultraviolet rays is CUV5>CUV7>CUV10. Therefore, in order to decrease the transmittance of ultraviolet rays, the number of inorganic sub-layer pairs included in the second inorganic layer IOL2, given the exemplary refractive indices, is preferably at least seven. When the number of inorganic sub-layer pairs included in the second inorganic layer IOL2 is 10, rather than 7, the transmittance of ultraviolet rays may be decreased even more. However, as the number of inorganic sub-layer pairs increases, the manufacturing cost increases. Therefore, it is desirable that the number of inorganic sub-layer pairs included in the second inorganic layer IOL2 is appropriately selected in consideration of UV transmittance and manufacturing cost.

For example, when the second inorganic layer IOL2 includes seven inorganic sub-layer pairs, that is, first to seventh inorganic sub-layer pairs ALP1 to ALP7 as illustrated in FIG. 6, the number of the first inorganic sub-layers AL1-1 to AL1-8 is eight, and the number of second inorganic sub-layers AL2-1 to AL2-7 is seven.

When the second inorganic layer IOL2 includes ten inorganic sub-layer pairs, that is, first to tenth inorganic sub-layer pairs, the number of the first inorganic sub-layers is 11 and the number of the second inorganic sub-layers is 10. Since the inorganic sub-layer disposed at the lowermost portion of the second inorganic layer IOL2, that is, directly contacting the light emitting diode LD and inorganic sub-layer disposed at the uppermost portion of the second inorganic layer IOL2 are each the first inorganic sub-layer, the number of first inorganic sub-layers included in the inorganic layer IOL2 may be one greater than the number of second inorganic sub-layers.

Figure 8:
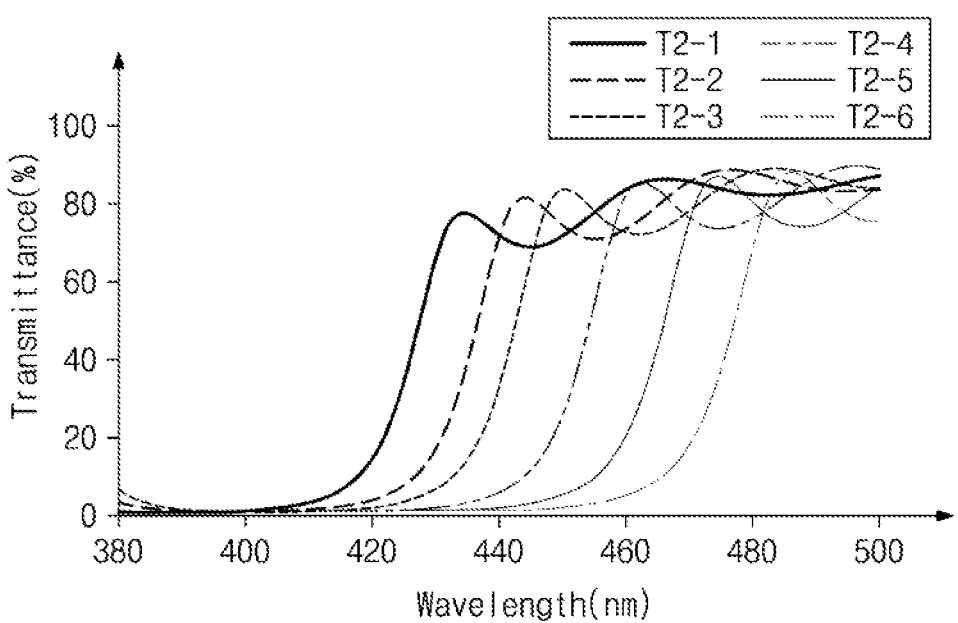
FIG. 8 is a graphical diagram illustrating light transmittance according to a thickness of a second inorganic sub-layer included in the second inorganic layer.

FIG. 8 illustrates light transmittance according to a thickness of the second inorganic sub-layers included in the second inorganic layer IOL2.

Referring to FIGS. 6 and 8, each of the first inorganic sub-layers AL1-1 to AL1-8 has a first thickness TH1 in the third direction DR3, and each of the second inorganic sub-layers AL2-1 to AL2-7 has a second thickness TH2 in the third direction DR3. The first thickness TH1 may be about 350 Å to about 600 Å, and the second thickness TH2 may be about 350 Å to about 600 Å, where 1 Angstrom (A) equals 0.1 nanometer (nm).

The wavelength of the reflected light may be adjusted by adjusting the second thickness TH2 of each of the second inorganic sub-layers AL2-1 to AL2-7.

In the example illustrated in FIG. 8, first to sixth transmittance versus wavelength curves T2-1 to T2-6 show light transmittances varying according to the second thicknesses TH2 of the second inorganic sub-layers AL2-1 to AL2-7 at six experimental thicknesses about 50 Å apart from about 600 Å down to about 350 Å. The first to sixth curves T2-1 to T2-6 show that the second thicknesses TH2 corresponding to thicknesses of about 600 Å to 350 Å, respectively, of the second inorganic sub-layers AL2-1 to AL2-7 have a relationship in which the cut-off wavelengths increase (or corresponding frequencies decrease) from about 420 nm to about 480 nm for light transmittances in that band according to transmittance curves T2-1<T2-2<T2-3<T2-4<T2-5<T2-6 corresponding to individual layer thicknesses of about 600 Å to 350 Å, respectively.

As can be seen in FIG. 8, as the second thicknesses TH2 of the second inorganic sub-layers AL2-1 to AL2-7 are increased, the transmittance of ultraviolet rays (for example, wavelengths of about 400 nm or less) may be substantially the same, but the transmittance of blue light (for example, wavelengths of about 400 nm to about 480 nm) may be decreased. When the transmittance of blue light is decreased, the efficiency of light emitted from the light emitting diode LD (refer to FIG. 5) may be decreased. Thus, in the example illustrated in FIG. 8, it is desirable that the experimental thickness corresponding to the second transmittance curve T2-2 is selected as the second thickness TH2 of each of the second inorganic sub-layers AL2-1 to AL2-7.

Table 1, below, shows the efficiency of blue light according to the second thickness TH2 of the second inorganic sub-layers AL2-1 to AL2-7 by way of example.

TABLE 1

| | the number of the second inorganic sub-layers | | | | | |
|---|---|---|---|---|---|---|
| | 0 | 1 | 2 | 3 | 4 | 5 |
| luminance (cd/m$^2$) | 137 | 135.9 | 134.1 | 127.1 | 127.1 | 108.6 |

As can be seen from Table 1, as the number of the second inorganic sub-layers increases, the luminance of blue light emitted from the light emitting diode LD decreases. That is, as the number of the second inorganic sub-layers increases, the light efficiency of the blue light decreases. Therefore, it is desirable that the number of the second inorganic sub-layers AL2-1 to AL2-7 is selected to minimize the decrease in light efficiency of the blue light rays while maximizing the blocking of the ultraviolet rays.

The display device having the configuration described above includes the thin-film encapsulation layer covering the upper surface of the organic light emitting diode, and thus it is possible to protect the organic light emitting diode from foreign substances such as moisture, oxygen, and dust. Furthermore, by alternately stacking the first protection film and the second protection film having different refractive indices from each other to form the thin-film encapsulation layer, it is possible to substantially reflect ultraviolet rays incident from the outside environment. Therefore, since the organic light emitting diode can be protected from ultraviolet rays, it is possible to suppress deterioration of display quality of the display device.

Although exemplary embodiments of the present disclosure have been described, it shall be understood that the inventive concept is not limited to these particular exemplary embodiments, but that various changes and modifications may be made therein by those of ordinary skill in the pertinent art while remaining within the scope and spirit of the present disclosure as hereinafter claimed. Therefore, the technical scope of the present disclosure should not be limited to the exemplary embodiments described, but should be defined by the appended claims.

What is claimed is:

1. A display device comprising:
a base layer;
a light emitting element layer disposed on the base layer; and
a thin-film encapsulation layer disposed on and encapsulating the light emitting element layer,
wherein the thin-film encapsulation layer includes an inorganic layer having at least one inorganic sub-layer pair,
wherein the at least one inorganic sub-layer pair includes a first inorganic sub-layer having a first refractive index and a second inorganic sub-layer disposed on the first inorganic sub-layer and having a second refractive index different from the first refractive index,
wherein a thickness of the second inorganic sub-layer is determined based on transmittance efficiency of at least blue light emitted from the light emitting element layer.

2. The display device of claim 1, further comprising:
a circuit element layer disposed between the base layer and the light emitting element layer,
wherein the light emitting element layer is electrically connected to the circuit element layer,
wherein the first refractive index is greater than the second refractive index,
wherein the first inorganic sub-layer contains SiNx and the second inorganic sub-layer contains SiON,
wherein the at least one inorganic sub-layer pair comprises at least seven inorganic sub-layer pairs.

3. The display device of claim 1,
wherein the inorganic layer further includes an upper inorganic sub-layer having an upper refractive index disposed on a top of the at least one inorganic sub-layer pair,
wherein the first refractive index and the upper refractive index are each greater than the second refractive index.

4. The display device of claim 3, wherein the upper inorganic sub-layer contains the same material as the first inorganic sub-layer.

5. The display device of claim 1, wherein the first refractive index of the first inorganic sub-layer is greater than the second refractive index of the second inorganic sub-layer.

6. The display device of claim 1, wherein the first refractive index of the first inorganic sub-layer is about 1.8 to about 2.1, and the second refractive index of the second inorganic sub-layer is about 1.5 to about 1.65.

7. The display device of claim 1, wherein the thin-film encapsulation layer further includes:
a lower inorganic layer disposed between the light emitting element layer and the inorganic layer, and
an organic layer disposed between the lower inorganic layer and the inorganic layer.

8. The display device of claim 1, wherein the first inorganic sub-layer has a first thickness and the second inorganic sub-layer has a second thickness.

9. The display device of claim 2, wherein the circuit element layer includes at least one transistor, and the light emitting element layer is electrically connected to the at least one transistor.

10. A display device comprising:
a base layer;
a circuit element layer disposed on the base layer;
a light emitting element layer disposed on the circuit element layer and electrically connected to the circuit element layer; and a thin-film encapsulation layer disposed on the circuit element layer and the light emitting element layer to encapsulate the circuit element layer and the light emitting element layer,
wherein the thin-film encapsulation layer includes:
  a first inorganic layer disposed on the light emitting element layer,
  an organic layer disposed on the first inorganic layer, and
  a second inorganic layer disposed on the organic layer,
wherein at least one of the first or second inorganic layers includes first inorganic sub-layers having a first refractive index and second inorganic sub-layers having a second refractive index different from the first refractive index,
wherein the first inorganic sub-layers and the second inorganic sub-layers are alternately disposed,
wherein a thickness of each of the second inorganic sub-layers is determined based on a transmittance efficiency of blue light.

11. The display device of claim 10,
wherein the first and second inorganic layers collectively include at least seven first inorganic sub-layers and at least seven second inorganic sub-layers,
wherein one of the first inorganic sub-layers of the first or second inorganic layers is stacked on the light emitting element layer.

12. The display device of claim 10, wherein one of the first inorganic sub-layers of the second inorganic layer is disposed on an uppermost portion of the second inorganic layer.

13. The display device of claim 10, wherein the number of the first inorganic sub-layers of the second inorganic layer is greater than the number of the second inorganic sub-layers.

14. The display device of claim 10, wherein the first inorganic sub-layer contains SiNx and the second inorganic sub-layer contains SiON.

15. The display device of claim 10, wherein the first refractive index of the first inorganic sub-layer is greater than the second refractive index of the second inorganic sub-layer.

16. The display device of claim 10, wherein the first refractive index of the first inorganic sub-layer is about 1.8 to about 2.1, and the second refractive index of the second inorganic sub-layer is about 1.5 to about 1.65.

17. The display device of claim 10, wherein each of the first inorganic sub-layers has a first thickness and each of the second inorganic sub-layers has a second thickness.

18. The display device of claim 10, wherein the thickness of each of the second inorganic sub-layers is determined based on the transmittance efficiency of at least blue light emitted from the light emitting element layer.

19. The display device of claim 10, wherein the circuit element layer includes at least one transistor, and the light emitting element layer is electrically connected to the at least one transistor.

* * * * *